United States Patent [19]
Morita

[11] Patent Number: 5,291,049
[45] Date of Patent: Mar. 1, 1994

[54] MOSFET WITH BURIED ELEMENT ISOLATION REGIONS

[75] Inventor: Shigeru Morita, Fujisawa, Japan

[73] Assignee: Kabushiki Kaisha Toshiba, Tokyo, Japan

[21] Appl. No.: 985,162

[22] Filed: Nov. 30, 1992

[30] Foreign Application Priority Data

Nov. 29, 1991 [JP] Japan .................. 3-315835

[51] Int. Cl.$^5$ .................. H01L 29/784; H01L 29/360
[52] U.S. Cl. .................. 257/335; 257/345; 257/513
[58] Field of Search .......... 257/513, 506, 290, 345, 257/497–505, 507–510, 622, 628, 630, 635, 648, 751, 335, 339

[56] References Cited

U.S. PATENT DOCUMENTS

| | | | |
|---|---|---|---|
| 4,471,525 | 9/1984 | Sasaki | 257/510 |
| 4,523,369 | 6/1985 | Nagakubo | 257/648 |
| 5,021,845 | 6/1991 | Hashimoto | 257/345 |
| 5,079,602 | 1/1992 | Harada | 257/622 |

*Primary Examiner*—Rolf Hille
*Assistant Examiner*—Alexander Oscar Williams
*Attorney, Agent, or Firm*—Spensley Horn Jubas & Lubitz

[57] ABSTRACT

The present invention comprises a buried element isolation region, an inversion preventing impurity diffusion region formed in a groove of a semiconductor substrate, a shallow channel impurity diffusion region, a deep channel impurity diffusion region, source and drain diffusion regions formed inside the buried element isolation region, an electrode wiring layer connected to the buried element isolation region across these diffusion regions, a first side-wall impurity diffusion region which is along the buried element isolation region, is in contact with the source and drain diffusion regions, and is formed at a position corresponding to at least the electrode wiring layer in a shallow region from the substrate surface, and a second side-wall impurity diffusion region formed in a deep region separated from the substrate surface at a position below the first side-wall impurity diffusion region and having an impurity concentration which is different from that of the deep channel impurity diffusion region and is also different from each of impurity concentrations of the inversion preventing impurity diffusion region and the first side-wall impurity diffusion region. For this reason, characteristics such as a threshold value, a punchthrough, and a back gate effect of the semi-conductor device can be freely controlled.

7 Claims, 5 Drawing Sheets

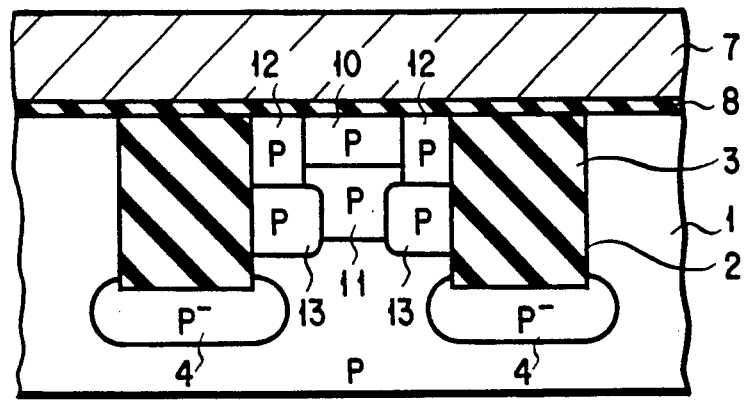
F I G. 5
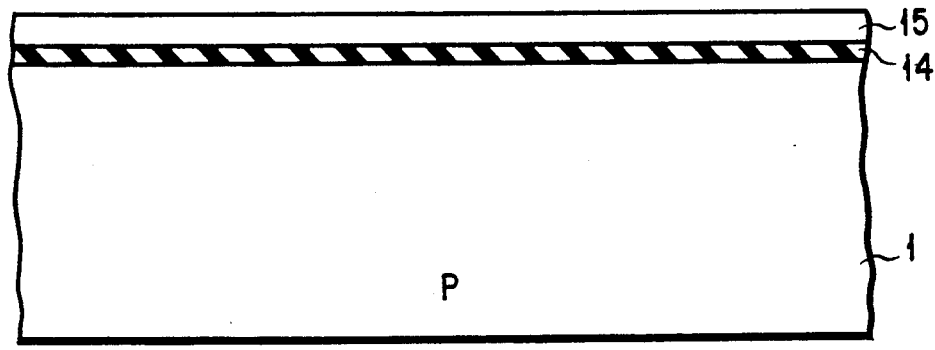
F I G. 6A
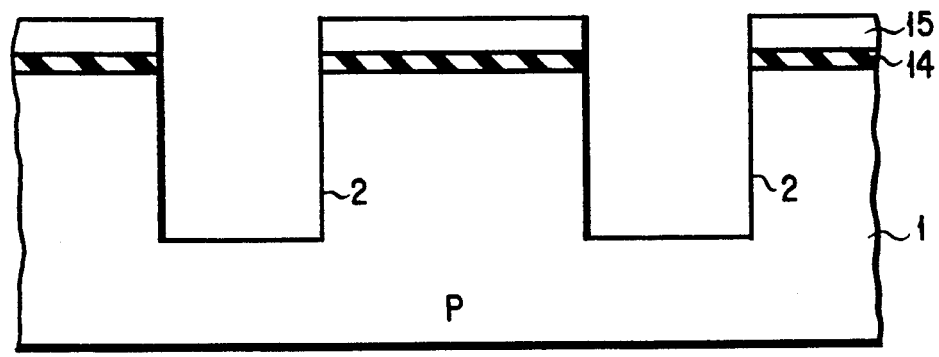
F I G. 6B

MOSFET WITH BURIED ELEMENT ISOLATION REGIONS

BACKGROUND OF THE INVENTION

1. Field of the Invention

The present invention relates to a semiconductor substrate and a method of manufacturing the same and, more particularly, to the structure of a MOS transistor using buried element isolation and a method of manufacturing the MOS transistor.

2. Description of the Related Art

In an integrated circuit using buried element isolation region, impurity ion concentrations in a channel region and a layer therebelow for determining the characteristics of a MOS transistor are controlled as follows. That is, before a gate electrode wiring layer is formed, the impurity ions are directly implanted in a semiconductor substrate from the upper direction. On the other hand, after a gate electrode wiring layer is formed, the impurity ions are implanted through the gate electrode wiring layer. In this case, "ion implantation for controlling impurity concentrations" means both shallow channel ion implantation for controlling a threshold value of the channel region, in which impurity ions are implanted in a shallow surface of the semiconductor substrate, and deep channel ion implantation for preventing a punchthrough phenomenon, in which impurity ions are implanted in a deep portion separated from the surface of the semiconductor substrate. As shown in FIG. 1, for example, an inversion preventing impurity diffusion region 21 in a buried element isolation region 3 for isolating an element #1 from an element #2 is formed as follows. That is, immediately after a groove 2 is formed in a semiconductor substrate 1, impurity ions are implanted in the semiconductor substrate 1 of the bottom portion of the groove 2 by means of normal ion implantation having an ion implantation angle of 7° or less using a mask material for forming the groove 2 as a mask, or impurity ions are uniformly implanted in the bottom and side walls of the groove 2 by means of oblique rotation ion implantation, or impurity ions having different concentrations are implanted in the bottom portion of the groove 2 and the side walls of the groove 2, respectively, by means of the normal ion implantation and the oblique rotation ion implantation. In FIG. 1, reference numerals 20, 7, and 8 denote a channel region, a gate electrode wiring layer, and a gate oxide film, respectively. With above element isolation techniques, both the element isolation characteristic of the buried element isolation region 3 and the various characteristics of a MOS transistor surrounded by the buried element isolation region 3 have been conventionally controlled.

According to the above conventional method of manufacturing a semiconductor device, since the characteristics of the MOS transistor depend on the structure of the buried element isolation regions which are in contact with each other, the element isolation characteristic and the characteristics of the MOS transistor cannot be independently determined. For this reason, required element characteristics cannot be easily obtained. In particular, as shown in FIG. 1, in a buried element isolation structure, concentration of the electric field caused by the gate electrode wiring layer 7 occurs near an element region 20a at a corner of the substrate 1 of an upper end of the groove 2. For this reason, a threshold value Vth of the channel region 20 is decreased, or the threshold value Vth is conspicuously varied due to an increase in electron trap in the gate oxide film 8 over time. Thus the reliability of the element may be degraded.

In a micropatterned MOS transistor, however, when impurity ions are locally implanted from the upper direction by means of shallow channel ion implantation, impurity ions having concentration different from that of the substrate surface at the central portion of the channel region 20 cannot be implanted near the element region 20a at the corner of the substrate of the upper end of the groove 2 by currently available photolithography due to limitations of processing dimensions and adjustment precision. In a region 1a below the channel region 20, as shown in FIG. 2, deep channel ion implantation having an impurity concentration different from that near the substrate surface of the channel region 20 is required to prevent a punchthrough phenomenon caused by connecting a depletion layer 22 to a depletion layer 23 between the source and the drain regions. However, when the deep channel ion implantation is performed at an excessively high concentration, a back gate effect is degraded. For this reason, the deep channel ion implantation has an optimal impurity concentration. This optimal value does not coincide with each of the concentrations of the inversion preventing impurity diffusion region 21, the portion near the element region 20a at the substrate corner of the upper end of the groove 2, and the substrate surface at the central portion of the channel region 20. In the buried element isolation structure having the inversion preventing impurity diffusion region 21 obtained by uniformly implanting an impurity in the side walls of the groove 2, when the impurity concentration is too high, the back gate effect is degraded. When the impurity concentration is too low, the threshold value of a portion near the element region 20a at the substrate corner of the upper end of the groove 2 may not be controlled.

SUMMARY OF THE INVENTION

It is an object of the present invention to provide a semiconductor device, capable of controlling various characteristics such as a threshold value, a punchthrough, and a back gate effect of a MOS transistor surrounded by a buried element isolation region without any influence of a buried element isolation structure, and to a method of manufacturing the semiconductor device.

According to an aspect of the present invention, there is provided a semiconductor device comprising a semiconductor substrate of a first conductivity type, a groove formed in the semiconductor substrate, a buried element isolation region formed in the groove, an inversion preventing impurity diffusion region of the first conductivity type formed on a bottom surface of the buried element isolation region, a shallow channel impurity diffusion region of the first conductivity type formed in a shallow depth from the surface of the semiconductor substrate at a center portion of a channel region to have an impurity concentration higher than that of the semiconductor substrate, a deep channel impurity diffusion region of the first conductivity type formed below the shallow channel impurity diffusion region to have an impurity concentration higher than that of the shallow channel impurity diffusion region, source and drain diffusion regions of a second conductivity type formed inside the buried element isolation region, an electrode wiring layer connected to the buried element isolation region across the source and drain diffusion regions, a first side-wall impurity diffusion region of the first conductivity type which is formed along side wall of the buried element isolation region, is connected to the source and drain diffusion regions and is formed at a position corresponding to at least the electrode wiring layer, the first side-wall impurity diffusion region having an impurity concentration higher than that of the shallow channel impurity diffusion region to control a threshold value of the channel region, and a second side-wall impurity diffusion region of the first conductivity type formed below the first side-wall impurity diffusion region and having an impurity concentration which is different from that of the deep channel impurity diffusion region and is also different from each of impurity concentrations of the inversion preventing impurity diffusion region and the first side-wall impurity diffusion region.

According to another aspect of the present invention, there is provided a method of manufacturing a semiconductor device, comprising the steps of forming a groove in a semiconductor substrate of a first conductivity type, forming an inversion preventing impurity diffusion region by doping an impurity of the first conductivity type in a bottom portion of the groove by ion implantation, forming a second side-wall impurity diffusion region by doping an impurity of the first conductivity type in an inner side wall of the groove by first oblique ion implantation, burying the groove with an insulating film in a halfway depth of the groove, forming a first side-wall impurity diffusion region of the first conductivity type by doping an impurity of the first conductivity type in the exposed side walls of the groove by second oblique ion implantation, burying the groove with the insulating film to a surface of the semiconductor substrate, forming a conductive film on the semiconductor substrate through a gate insulating film, forming a gate electrode wiring layer on the semiconductor substrate by processing the conductive film by photolithography, and forming source and drain diffusion regions of a second conductivity type by doping an impurity of the second conductivity type in a surface of the semiconductor substrate by ion implantation in a self-aligning manner using the gate electrode wiring layer as a mask.

In the present invention, the various characteristics of a MOS transistor isolated by using buried element isolation region can be controlled independently of the element isolation characteristic of a buried element isolation region. For this reason, in micropatterned MOS transistors which are isolated from each other by the buried element isolation region to be largely integrated, their performance such as the maximum current supply capability and switching speed of the integrated MOS transistors can be obtained and, at the same time, the reliability of the MOS transistors can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional view showing the semiconductor device taken along a line II—II in FIG. 3 when viewed in an arrow direction in FIG. 3; and FIGS. 6A to 6H are sectional views showing the steps in manufacturing the semiconductor device according to the present invention.

DETAILED DESCRIPTION OF THE PREFERRED EMBODIMENT

An embodiment of a semiconductor device according to the present invention will be described in detail with reference to the accompanying drawings.

Figure 1:
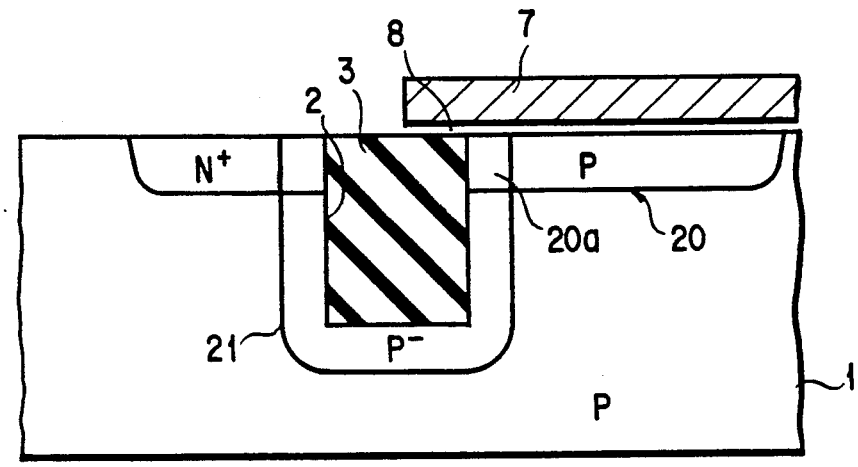
FIG. 1 is a sectional view for explaining an inversion preventing impurity diffusion region of a buried element isolation region.
Figure 2:
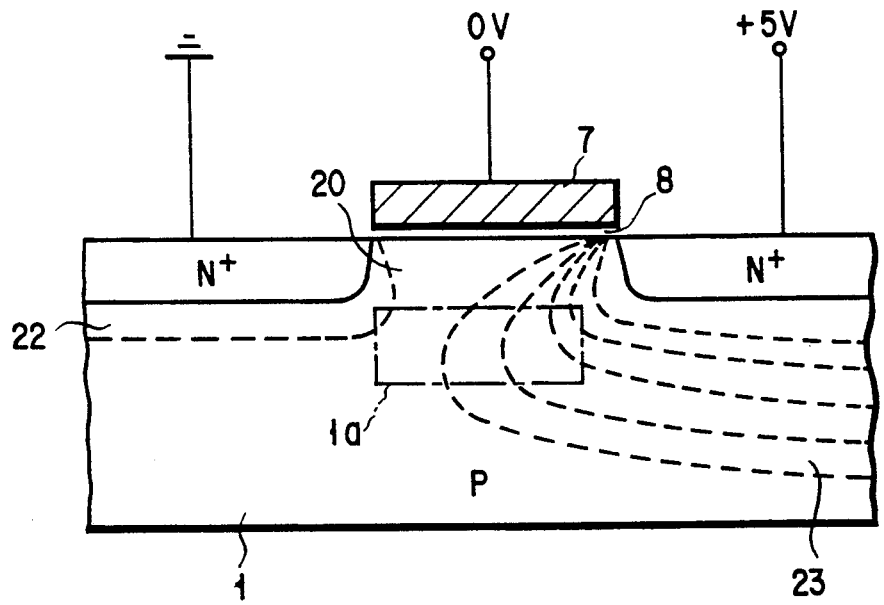
FIG. 2 is a sectional view for explaining a punch-through phenomenon.
Figure 3:
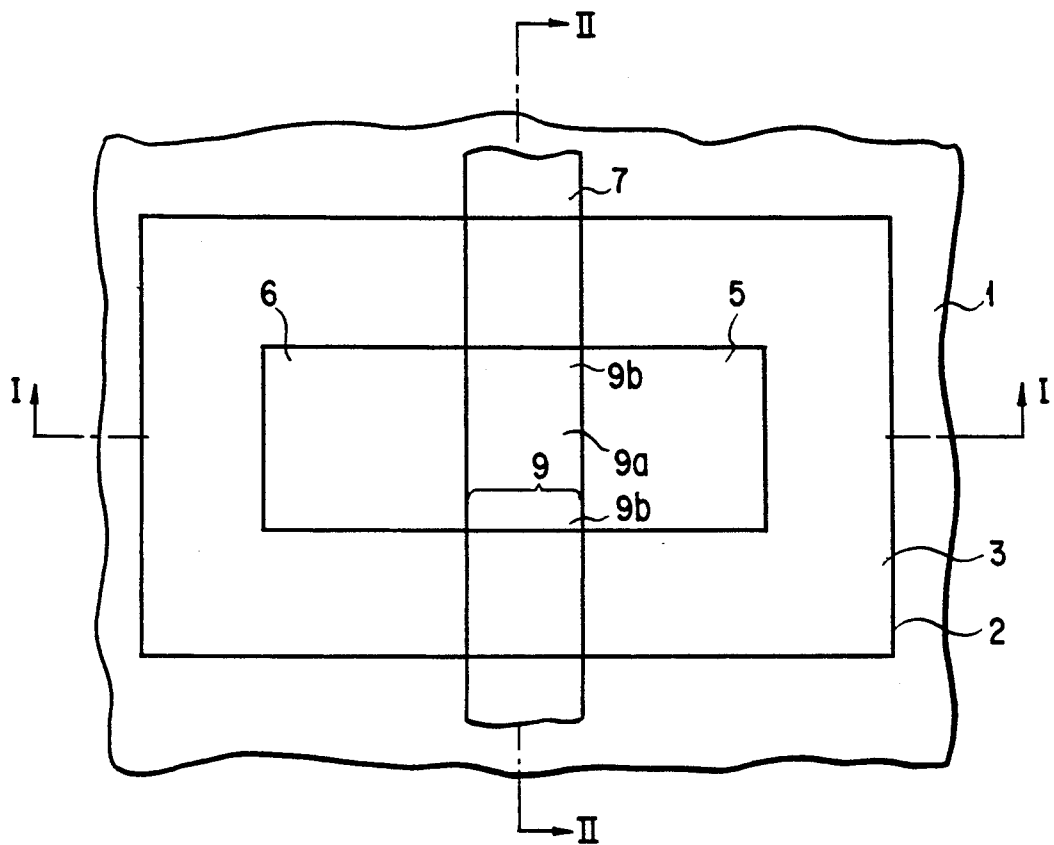
FIG. 3 is a plan view showing a semiconductor device according to a embodiment of the present invention.
Figure 4:
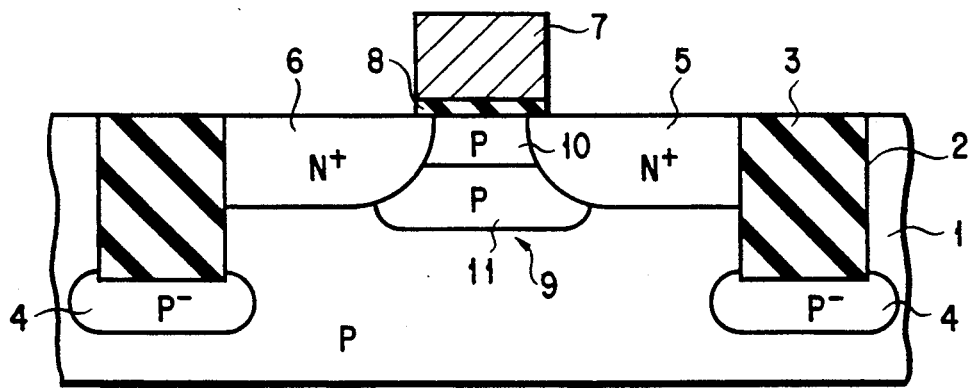
FIG. 4 is a sectional view showing the semiconductor device taken along a line I—I in FIG. 3 when viewed in an arrow direction in FIG. 3.

FIG. 3 is a plan view showing the structure of the semiconductor device according to the present invention. FIG. 4 is a sectional view showing the semiconductor device taken along a line I—I in FIG. 3 when viewed in a direction of an arrow in FIG. 3. FIG. 5 is a sectional view showing the semiconductor device taken along a line II—II in FIG. 3 when viewed in a direction of an arrow in FIG. 3. This embodiment describes an NMOS transistor, and reference numeral 1 in FIGS. 3 to 5 denotes a P-type semiconductor substrate 1 having a crystal orientation (100) and a resistivity of 1 to 2 $\Omega$.cm. A groove 2 having, e.g., a hollow rectangular shape and a depth of 0.5 $\mu$m is formed in the P-type semiconductor substrate 1. A buried element isolation region 3 consisting of an insulating film (CVD-SiO$_2$) is formed in the groove 2. Boron ions are implanted in the bottom portion of the buried element isolation region 3, i.e., the bottom portion of the groove 2 to form a P$^-$-type inversion preventing impurity diffusion region 4 (a dose of about $8 \times 10^{17}$ cm$^{-3}$). A dose of $2 \times 10^{13}$ cm$^{-2}$ and an acceleration voltage of 30 keV is used in the ion implantation. A source diffusion region 5 and a drain diffusion region 6 serving as element regions are formed inside the hollow-rectangular-shaped buried element isolation region 3. A gate electrode wiring layer 7 is formed across the source and drain diffusion regions 5 and 6 and connected to the buried element isolation region 3. Reference numeral 8 denotes a gate insulating film. The source and drain diffusion regions 5 and 6 are N$^+$-type diffusion regions each having a depth of 0.25 $\mu$m. The diffusion regions 5 and 6 are formed by implanting As ions at a dose of $5 \times 10^{15}$ cm$^{-3}$ and an acceleration voltage of 35 keV in a self-aligned manner using the gate electrode wiring layer 7 consisting of poly-Si as a mask. Each of the N$^+$-type diffusion regions 5 and 6 has a dose of about $1 \times 10^{22}$ cm$^{-2}$. A P-type shallow channel impurity diffusion region 10 (a dose of about $1.3 \times 10^{17}$ cm$^{-3}$) having a depth of 0.15 $\mu$m, for controlling a threshold value of the central portion of a channel region 9 is formed near the surface of the semiconductor substrate 1 at the central portion of the channel region 9 separated from the buried element isolation region 3. The diffusion region 10 is formed by implanting $BF_2$ ions shallowly at a dose of about $2\times10^{12}$ cm$^{-2}$ and an acceleration voltage of 20 keV. A P-type deep channel impurity diffusion region 11 (a does of about $3\times10^{17}$ cm$^{-3}$) located at a depth of 0.15 to 0.35 μm from the substrate surface, for controlling a punch-through phenomenon is formed below the P-type shallow channel impurity diffusion region 10. The diffusion region 11 is formed by implanting B ions at a dose of about $6\times10^{12}$ cm$^{-2}$ and an acceleration voltage of 80 keV. A first P-type side-wall impurity diffusion region 12 (a dose of about $6\times10^{17}$ cm$^{-3}$) are formed near the surface of the semiconductor substrate 1 of the end of the channel region 9 adjacent to the buried element isolation region 3. The diffusion region 12 is formed by obliquely implanting $BF_2$ ions from the side walls of the buried element isolation region 3 at a dose of about $7\times10^{12}$ cm$^{-2}$, an acceleration voltage of 15 keV, and an implantation angle of 60°. The diffusion region 12 has a depth of 0.2 μ, extends from the end of the gate electrode wiring layer 7 to the inner side by 0.15 μm, and controls the threshold value of the end of the channel region 9. A second P-type side-wall impurity diffusion region 13 (a dose of about $4\times10^{17}$ cm$^{-3}$) are formed below the first P-type side-wall impurity diffusion region 12. The diffusion region 13 is formed by obliquely implanting $BF_2$ ions in the side walls of the buried element isolation region 3 at a dose of about $1.5\times10^{12}$ cm$^{-2}$, an acceleration voltage of 35 keV, and an implantation angle of 60°. The diffusion region 13 has a depth of 0.2 to 0.4 μm, extends from the end of the gate electrode wiring layer 7 to the inner side by 0.2 μm, and controls a punchthrough phenomenon. The impurity concentrations of the shallow channel impurity diffusion region 10, the first side-wall impurity diffusion region 12, and the inversion preventing impurity diffusion region 4 are set to be high in the order named. The impurity concentration of the deep channel impurity diffusion region 11 is higher than that of the shallow channel impurity diffusion region 10. The impurity concentration of the second side-wall impurity diffusion region 13 is set to be higher than that of at least the deep channel impurity diffusion region 11 when each of the second side-wall impurity diffusion region 13 is used to prevent a punchthrough phenomenon. However, in a device wherein the deep channel impurity diffusion region 11 can satisfactorily prevent a punchthrough phenomenon, in contrast to the above description, the impurity concentration of the second side-wall impurity diffusion region 13 may be set to be lower than that of the deep channel impurity diffusion region 11 to achieve a high-speed operation.

According to the present invention, in each of MOS transistors isolated from each other by buried element isolation region, the concentrations of the shallow and deep channel impurity diffusion regions of the MOS transistor and the concentrations of the first and second side-wall impurity diffusion regions can be freely controlled independently of the element isolation characteristic of a buried element isolation region, i.e., the control of the impurity concentration of an inversion preventing impurity diffusion region to control various characteristics of the MOS transistor independently. For this reason, in micropatterned MOS transistors which are isolated from each other by the buried element isolation region to be largely integrated, their performance such as the maximum current supply capability and switching speed of the MOS transistors can be obtained and, at the same time, the reliability of the MOS transistors can be improved.

Next, a method of manufacturing the semiconductor device according to the present invention will be described with reference to FIGS. 6A to 6H.

Figure 6C:
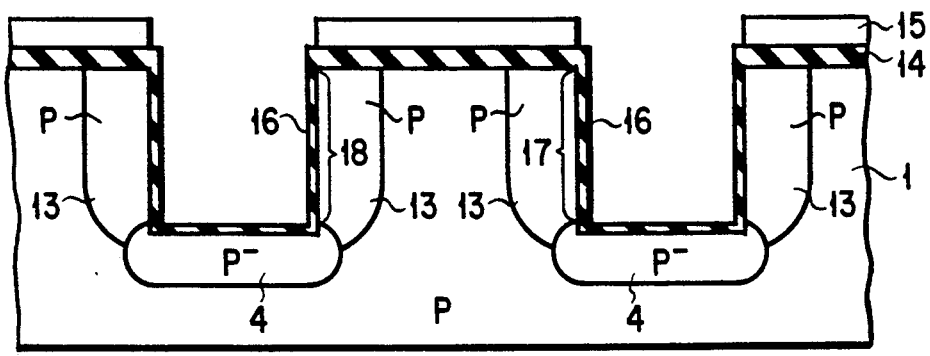
Figure 6D:
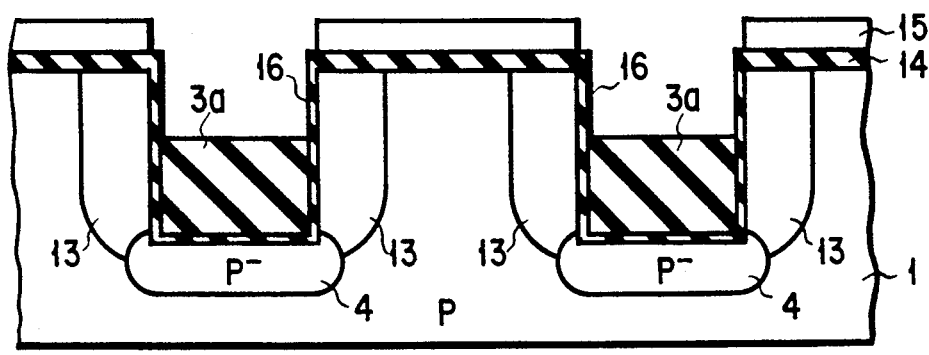
Figure 6E:
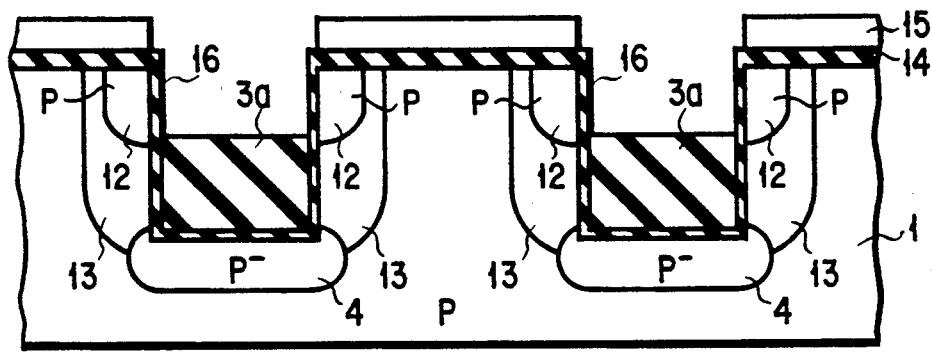
Figure 6F:
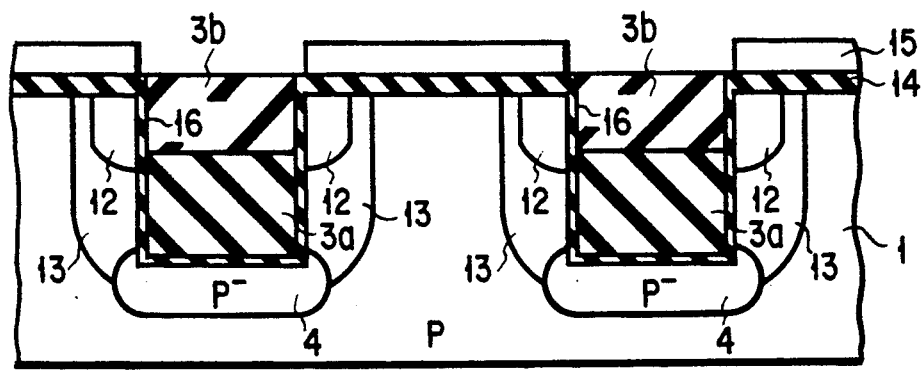
Figure 6G:
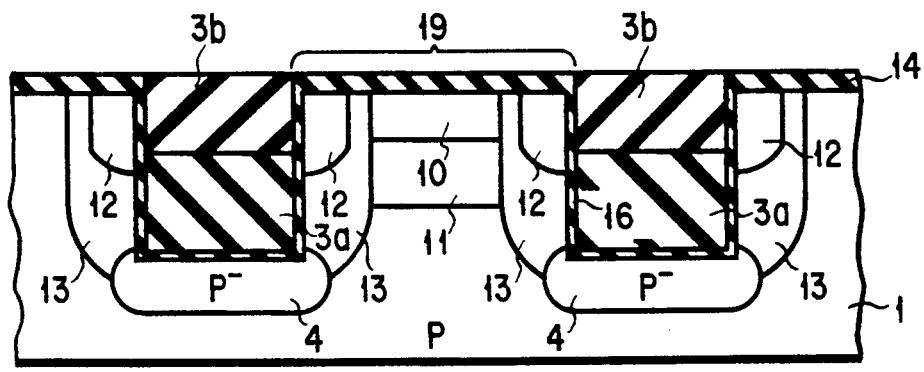
Figure 6H:
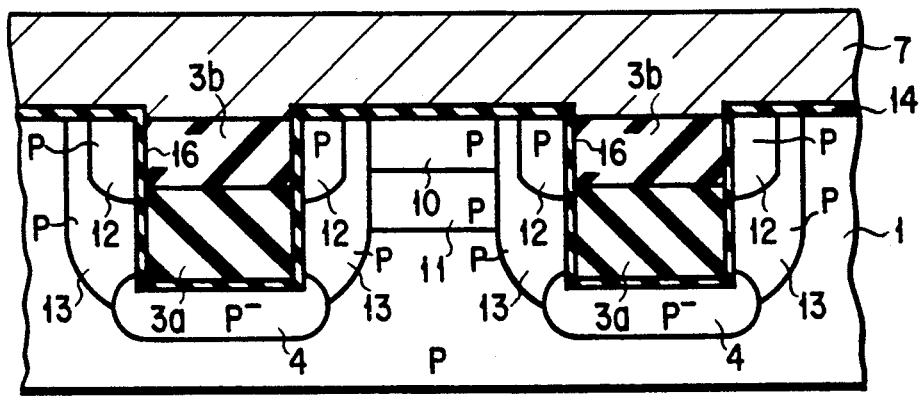

As shown in FIG. 6A, a substrate protection film 14 is formed on the P-type semiconductor substrate 1 having a crystal orientation (100) and a resistivity of 1 to 2 Ω.cm by thermal oxidation using dry $O_2$ at 900° C. to have a thickness of 50 nm. An SiN film 15 is formed on the substrate protection film 14 to have a thickness of 100 nm. As shown in FIG. 6B, the SiN film 15 and the substrate protection film 14 at a portion prospectively serving as the buried element isolation region 3 are removed by photolithography. The groove 2 is formed in the semiconductor substrate 1 using the SiN film 15 as a mask to have a depth of 0.5 μm. As shown in FIG. 6C, thermal oxidation using dry $O_2$ at 900° C. is performed to form an oxide film 16 having a thickness of 10 nm on the surface of the semiconductor substrate 1 in the groove 2. Subsequently, B ions are implanted by means of normal ion implantation having an ion implantation angle of 7° or less, a dose of about $2\times10^{13}$ cm$^{-2}$, and an acceleration voltage of 20 keV to form the P$^-$-type inversion preventing impurity diffusion region 4 in the bottom portion of the groove 2. The second P$^+$-type side-wall impurity diffusion region 13 serving as a region which is connected to the source diffusion region 5 and the drain diffusion region 6 immediately below the gate electrode wiring layer 7 across the element region and the buried element isolation region 3 is formed. The diffusion region 13 is formed by obliquely implanting $BF_2$ ions in a pair of side walls 17 and 18 of the semiconductor substrate 1 using the SiN film 15 as a mask. The oblique ion implantation is performed by a rotation ion implantation at a dose of about $1.5\times10^{12}$ cm$^{-2}$, an acceleration voltage of 35 keV, and an ion implantation angle of 60°. As shown in FIG. 6D, a CVD-SiO$_2$ film is buried in the groove 2 by epitaxial growth to form a buried element isolation region 3a. Subsequently, the SiN film 15 and the CVD-SiO$_2$ film on the surface of the semiconductor substrate 1 are etched by RIE (Reactive Ion Etching) to expose the upper 0.2-μm part of each of the side walls 17 and 18 in the groove 2, so as to leave the element isolation region 3a in only the deep region of the groove 2. As shown in FIG. 6E, as the second oblique ion implantation, $BF_2$ ions are implanted by rotation ion implantation to form the first P-type side-wall impurity diffusion region 12. A dose of $7\times10^{12}$ cm$^{-2}$, an acceleration voltage of 15 keV, and an ion implantation angle of 60° is used in the ion implantation. As shown in FIG. 6F, a CVD-SiO$_2$ film is buried in the groove 2 by epitaxial growth to form a buried element isolation region 3b. Subsequently, the *CVD-SiO$_2$* film is etched by anisotropic etching (RIE) to expose the SiN film 15 on the surface of the semiconductor substrate 1. The groove 2 is completely buried to form the buried element isolation region 3b. As shown in FIG. 6G, the SiN film 15 on the semiconductor substrate 1 is removed by CDE (Chemical Dry Etching). $BF_2$ ions are implanted in the shallow surface of the semiconductor substrate 1 in an element region 19 through the remaining substrate protection film 14 to control the characteristics of the element. A dose of $2\times10^{12}$ cm$^{-2}$ and an acceleration voltage of 20 keV is used. The P-type shallow channel impurity diffusion region 10 (a dose of about $1.3 \times 10^{17}$ cm$^{-3}$) is thus formed. B ions are deeply implanted at a dose of $6 \times 10^{12}$ cm$^{-2}$ and an acceleration of 80 keV to form the P-type deep channel impurity diffusion region 11 for controlling a punchthrough phenomenon. As shown in FIG. 6H, the substrate protection film 14 is removed with an H$_4$F solution, Subsequently, the gate insulating film 8 (FIG. 4) is formed on the exposed surface of the semiconductor substrate 1 by means of thermal oxidation using dry O$_2$ at 900° C. Furthermore, a polysilicon film is formed on the gate insulation film 8 to have a thickness of 400 nm. P ions are diffused in the polysilicon film by thermal oxidation in a POC 13 atmosphere at 950° C. for 40 minutes to decrease the resistance of the polysilicon film. Although not shown, the polysilicon film is processed by photolithography using anisotropic etching (RIE) to form the gate electrode wiring layer 7. Subsequently, as ions are implanted using the gate electrode wiring layer 7 as a mask to form N+-type diffusion regions serving as the source diffusion region 5 and the drain diffusion region 6 (FIG. 4). A dose of $5 \times 10^{15}$ cm$^{-2}$ and an acceleration voltage of 35 keV is used. An insulating interlayer (not shown) is then formed, contact holes for extracting lead electrode wires are formed, and lead electrode wiring (Al) is formed. As a result, a required element is formed on the semiconductor substrate 1.

In the above embodiment, after the buried element isolation region 3 and the first and second side-wall impurity diffusion regions 12 and 13 are formed, the shallow channel impurity diffusion region 10, the deep channel impurity diffusion region 11, and the gate electrode wiring layer 7 are formed. However, the buried element isolation regions 3 and the first and second side-wall impurity diffusion regions 12 and 13 may be formed after some of the shallow channel impurity diffusion region 10, the deep channel impurity diffusion region 11, and the gate electrode wiring layer 7 are formed on the semiconductor substrate 1.

As described above, in the integrated circuit of the present invention using the buried element isolation region, the impurity concentration of the end portion of the channel region of the MOS transistor element contacting with the buried element isolation region is set to be different from those of a shallow portion near the surface of the substrate and a deep portion of the substrate, below the shallow portion. Besides, the impurity concentration of the end portion of the channel region is also set to be different from those of the semiconductor substrate and the center portion of the channel region away from the buried element isolation region. As a result, it is compatible according to the present invention that the TD channel effect and the short channel effect of the MOS transistor can be prevented and the element isolation characteristics o the MOS transistor can be independently controlled.

Additional advantages and modifications w 11 readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type;
    a groove formed in said semiconductor substrate;
    a buried element isolation region formed in said groove;
    an inversion preventing impurity diffusion region of the first conductivity type formed in a bottom surface of said buried element isolation region;
    a shallow channel impurity diffusion region of the first conductivity type formed in a shallow depth from the surface of said semiconductor substrate at a center portion of a channel region to have an impurity concentration higher than that of said semiconductor substrate;
    a deep channel impurity diffusion region of the first conductivity type formed below said shallow channel impurity diffusion region to have an impurity concentration higher than that of said shallow channel impurity diffusion region;
    source and drain diffusion regions of a second conductivity type formed inside said buried element isolation region;
    an electrode wiring layer connected to said buried element isolation region and extending across said source and drain diffusion regions;
    a first side-wall impurity diffusion region of the first conductivity type which is formed along a side wall of said buried element isolation region, is connected to said source and drain diffusion regions and is formed at a position corresponding to at least said electrode wiring layer, said first side-wall impurity diffusion region having an impurity concentration higher than that of said shallow channel impurity diffusion region to control a threshold value of said channel region; and
    a second side-wall impurity diffusion region of the first conductivity type formed below said first side-wall impurity diffusion region and having an impurity concentration which is different from that of said deep channel impurity diffusion region and is also different from each of impurity concentrations of said inversion preventing impurity diffusion region and said first side-wall impurity diffusion region.

2. A device according to claim 1, wherein said first side-wall impurity diffusion region has a lower impurity concentration than that of said inversion preventing impurity diffusion region, and said shallow channel impurity diffusion region has a lower impurity concentration than that of said first side-wall impurity diffusion region.

3. A device according to claim 1, wherein said second side-wall impurity diffusion region has a higher impurity concentration than at least that of said deep channel impurity diffusion region to prevent a punchthrough.

4. A device according to claim 3, wherein said second side-wall impurity diffusion region has a lower impurity concentration than that of said first side-wall impurity diffusion region.

5. A device according to claim 1, wherein said second side-wall impurity diffusion region has a lower impurity concentration than that of said deep channel impurity diffusion region to enhance an operation speed.

6. A device according to claim 5, wherein said second side-wall impurity diffusion region has a higher impurity concentration than that of said shallow channel impurity diffusion region.

7. A device according to claim 1, wherein said second side-wall impurity diffuse region is located on said side wall of said buried element isolation region in said semiconductor substrate and is formed so as to partially surround one of said channel regions.

* * * * *